United States Patent [19]

Ishigaki

[11] Patent Number: 4,495,428
[45] Date of Patent: Jan. 22, 1985

[54] CIRCUIT ARRANGEMENT FOR DERIVING A LEVEL CONTROL SIGNAL USING SILICON DIODES

[75] Inventor: Yukinobu Ishigaki, Machida, Japan

[73] Assignee: Victor Company of Japan, Limited, Yokohama, Japan

[21] Appl. No.: 386,157

[22] Filed: Jun. 7, 1982

[30] Foreign Application Priority Data

Jun. 9, 1981 [JP] Japan ................................. 56-88460
Jun. 9, 1981 [JP] Japan ................................. 56-88461
Jun. 9, 1981 [JP] Japan ................................. 56-88459
Jun. 15, 1981 [JP] Japan ................................. 56-92027
Jul. 13, 1981 [JP] Japan ................................. 56-109128

[51] Int. Cl.³ .......................... G06G 7/12; H03K 5/00
[52] U.S. Cl. ..................................... 307/490; 307/494; 307/264; 328/26
[58] Field of Search ............... 307/490, 491, 494, 503, 307/264; 328/26

[56] References Cited

U.S. PATENT DOCUMENTS 3,660,768  5/1972  Dammann et al. .................... 328/26
4,243,940  1/1981  Ruof ..................................... 328/26
4,337,434  6/1982  Fogel et al. .......................... 307/503

Primary Examiner—Stanley D. Miller
Assistant Examiner—B. P. Davis
Attorney, Agent, or Firm—Pollock, VandeSande & Priddy

[57] ABSTRACT

A circuit arrangement for deriving a control signal from an audio input signal for level-controlled audio systems comprises a first amplifier/comparator and a first silicon diode for coupling its output signal to a first circuit junction. A feedback circuit is provided for coupling the signal at the first circuit junction to the input of the first amplifier/comparator. A second amplifier/comparator is provided having its output coupled to a second silicon diode which passes its output signal to a second circuit junction. A first feedback resistor is provided to apply the signal at the second circuit junction to the input of the second amplifier/comparator and a second feedback resistor applies an output signal from the second amplifier/comparator to the input thereof. The arrangement is such that the audio input signal is applied to at least one of the first and second amplifier/comparators and one of the first and second circuit junctions is connected to a time constant circuit so that the signal applied thereto comprise linearly detected, unipolar halfwaves of the input signal. The first and second feedback resistors are chosen so that desired operating characteristics are obtained.

12 Claims, 20 Drawing Figures

CIRCUIT ARRANGEMENT FOR DERIVING A LEVEL CONTROL SIGNAL USING SILICON DIODES

BACKGROUND OF THE INVENTION

The present invention relates generally to audio level control and/or noise reduction systems, and in particular to a circuit arrangement for generating a level control signal using silicon diodes, the circuit being advantageously used for level controlled audio systems which are also designed to be associated with control signal generating circuits having germanium diodes.

Conventional circuits for deriving a level control signal from an audio input signal comprise a time constant circuit to which a rectified audio input is applied to generate a level control signal. The audio signal is conventionally rectified by a rectifier using germanium or silicon diodes as rectifiying elements. However, due to the significant difference in operating parameters between germanium and silicon diodes, the attack time of silicon constructed circuits differs significantly from those constructed of germanium diodes. Because of the inherent advantageous properties of silicon for integrated-circuits technology, silicon constructed circuitry is increasing in number with resultant undesirable consequences.

SUMMARY OF THE INVENTION

The present invention provides a silicon-constructed circuit for deriving from an input signal a level control signal, the circuit having operating characteristics which would be obtained from germanium constructed circuits.

The circuit arrangement according to the invention comprises a first amplifier/comparator, and a first silicon diode coupled to the output of the first amplifier/comparator for passing an output therefrom to a first circuit junction. A feedback circuit is provided for coupling the signal at the first circuit junction to the input of the first amplifier/comparator. A second amplifier/comparator is provided having its output coupled to a second silicon diode which passes an output signal therefrom to a second circuit junction. A first feedback resistor is provided to apply the signal at the second circuit junction to the input of the second amplifier/comparator and a second feedback resistor applies the signal at the output of the second amplifier/comparator to the input thereof. The arrangement is such that the input terminal is connected to at least one of the first and second amplifier/comparators and one of the first and second circuit junctions is connected to a time constant circuit so that the signal applied thereto comprise linearly detected, unipolar halfwaves of the input signal.

The resistance values of the first and second feedback resistors are chosen in relation to each other so that the operating characteristics of the silicon constructed circuit are rendered similar to those obtained with germanium constructed circuits.

BRIEF DESCRIPTION OF THE DRAWINGS

The present invention will be described in further detail with reference to the accompanying drawings, in which.

DETAILED DESCRIPTION

Figure 1:
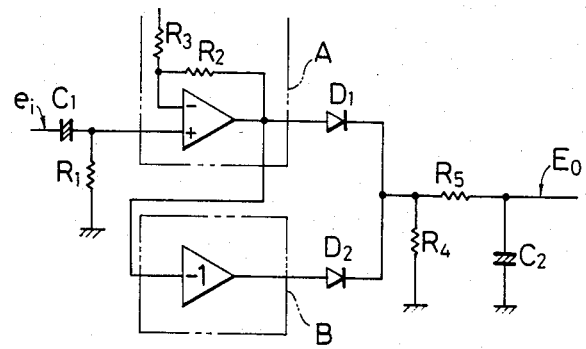
FIG. 1 is a circuit diagram of a prior art circuit for generating a level control signal.

Before describing the present invention, reference is first had to FIG. 1 in which a typical example of prior art audio level control circuits for noise reduction systems is illustrated as comprising amplifiers A and B, an input circuit formed by a capacitor C1 and a resistor R1, and a time constant circuit formed by a resistor R5 and a capacitor C2 and coupled from the outputs of amplifiers A and B through diodes D1 and D2, respectively. The amplifier A is an operational amplifier having its noninverting input coupled through capacitor C1 to receive an input signal $e_i$. The inverting input of amplifier A, biased to a voltage supplied through a resistor R3, is coupled through a feedback resistor R2 to its output terminal to provide amplification of input signal $e_i$ which is applied to diode D1. The amplifier B is a unity gain inverting amplifier having its input coupled to the output of amplifier A to provide an inverted and amplified input signal $e_i$ to the diode D2. Diodes D1 and D2 have their anodes coupled to the outputs of respective amplifiers and their cathodes coupled together to ground by a resistor R4 to develop a rectified output thereacross. The rectified output is applied to the time constant circuit R5, C2 to deliver an audio level control signal Eo.

However, the internal resistance of germanium diodes is 1/500 to 1/1000 of that of silicon diodes. Due to this difference in internal resistance the output impedance of the audio level control circuit and the input-output characteristic for low level audio signals vary significantly among different circuits depending on the type of diodes used. Curves G and S in FIG. 5 respectively indicate input-vs-output characteristics of the circuit of FIG. 1 when germanium and silicon are used for both diodes D1 and D2.

The input-output characteristic of the control signal generating circuit will affect the level compression and expansion characterstics of an associated noise reduction system, and will also affect the level compression characteristic of audio limiters. Furthermore, the output impedance of the circuit will affect the attack time of such associated systems.

Figure 2:
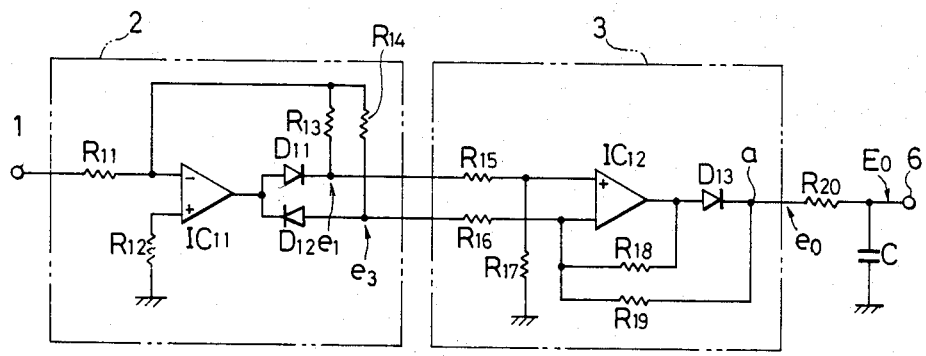
FIG. 2 is a circuit diagram of a first embodiment of the present invention.

Referring now to FIG. 2 there is shown a first preferred embodiment of the audio level control circuit of the invention. The circuit generally comprises a linear detector 2, a transfer circuit 3 and a time constant circuit formed by a resistor R20 and a capacitor C. The linear detector 2 comprises an integrated circuit operational amplifier or comparator IC11 having an inverting input coupled to an input terminal 1 of the control circuit via a resistor R11 and a noninverting input coupled to ground by a resistor R12. The output of the comparator IC11 is coupled through a first channel comprising a silicon diode D11 coupled in a sense to apply a positive output from the amplifier IC11 to one end of a feedback resistor R13 and through a second channel comprising a silicon diode D12 coupled in opposite sense to diode D11 to apply a negative output of comparator IC11 to one end of a feedback resistor R14, the other ends of resistors R13 and R14 being coupled together to the inverting input of comparator IC11.

The transfer circuit 3 translates translate the input signal applied thereto to an output signal in accordance with a predetermined transfer function describing the relationship between the input-to-output characteristic of a circuit formed by germanium diodes and the input-to-output characteristic of a circuit formed by silicon diodes. The transfer circuit 3 comprises an integrated circuit operational amplifier or comparator IC12 having a noninverting input coupled to the first channel through a resistor R15 and an inverting input coupled to the second channel through a resistor R16, the noninverting input being further coupled by a resistor R17 to ground. The output of the amplifier IC12 is connected through a silicon diode D13, which is poled to conduct in response to a positive output from comparator IC12, to the time constant resistor R20 and thence to the output terminal 6 of the control circuit. A feedback path is provided by a resistor R18 coupled from the output of comparator IC12 to the inverting input thereof and another feedback path is provided by a resistor R19 coupled from the cathode of diode D13 to the inverting input of the comparator.

Figure 3A:
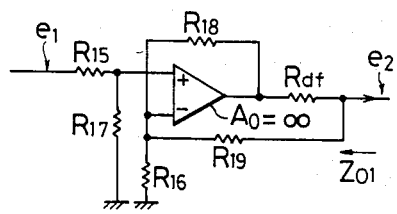
FIGS. 3a and 3b are equivalent circuits of the transfer circuit of FIG. 2.
Figure 3B:
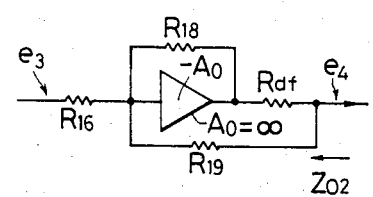
Figure 4:
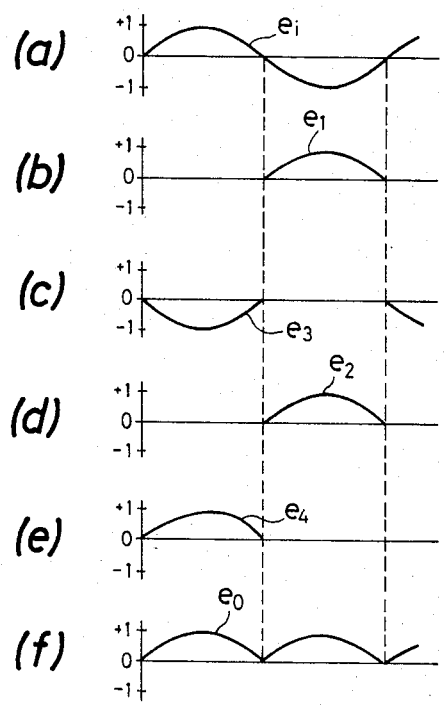
FIG. 4 is a waveform diagram associated with the circuit of FIG. 2.

An audio input signal $e_i$, typically shown at a in FIG. 4, is applied to the terminal 1 and fed to the inverting input of comparator IC11. The negative halfwave of the input signal $e_i$ is converted in polarity and appears as a positive halfwave $e_1$, shown at b in FIG. 4, and is passed through diode D11 and resistor R15 to the noninverting input of comparator IC12 of the transfer circuit 3, whereas the negative halfwave $e_3$ (shown at c, FIG. 4) of the amplified signal appears is passed through diode D12 and resistor R16 to the inverting input of amplifier IC12. The transfer circuit 3 can be represented by two equivalent circuits shown in FIGS. 3a and 3b according to input signals $e_1$ and $e_3$ applied thereto from the linear detector 2. The transfer circuit 3 will now be analyzed in quantitative terms using the equivalent circuits. For convenience the amplification gain of comparator IC12 is assumed to be infinite. The circuit gain $e_2/e_1$ and output impedance $Z_{o1}$ of FIG. 3a are given by Equations (1) and (2) as follows:

$$\frac{e_2}{e_1} = \frac{R17}{R15 + R17}\left(1 + \frac{R18 \cdot R19}{R16(R18 + Rdf + R19)}\right) \quad (1)$$

$$Z_{o1} = \frac{Rdf \cdot R19}{R18 + Rdf + R19} \quad (2)$$

where, Rdf represents the forward resistance of diode D13.

Likewise, the circuit gain $e_4/e_3$ and the output impedance of the circuit of FIG. 3b are given as follows:

$$\frac{e_4}{e_3} = -\frac{R18 \cdot R19}{R16(R18 + Rdf + R19)} \quad (3)$$

$$Z_{o2} = \frac{Rdf \cdot R19}{R18 + Rdf + R19} \quad (4)$$

For a typical example, by setting R15=R17=R16=R19=several tens of kiloohms, and R18=R19×20, the output signals $e_2$ and $e_4$ (shown at d and e respectively in FIG. 4) of the equivalent circuits have the same amplitudes even though the resistance Rdf may vary from several tens of ohms to several hundreds ohms. The signals $e_2$ and $e_4$ are combined to give an output $e_o$ (shown at f in FIG. 4) at the output of the transfer circuit 3 which is integrated into an audio level control signal Eo. Due to the fact that the diode D13 is included in the negative feedback loop and is arranged such that its internal resistance is reduced in proportion to the amount of signal fed back to the input of comparator IC12, the time constant value of the audio level control system is less affected by the resistance of the silicon diode D13.

Since the output impedance Zo ($=Z_{o1}=Z_{o2}$) can be equated to that be obtained when the forward resistance Rdf of the silicon diode D13 has changed to Rdf' by the action of a negative feedback operation when it turns on in response to a positive output from amplifier IC12, the following Equation holds:

$$Rdf' = \frac{Rdf \cdot R19}{R18 + Rdf + R19} \quad (5)$$

When the diode D13 is turned off, the forward resistance Rdf becomes infinite and the output impedance Zo' in this instance is given by $$Zo' = R19 \quad (6)$$

Therefore, the attack time Ta and recovery time Tr are given as follows:

$$Ta = (Rdf' + R20)C \quad (7)$$

$$Tr = (R19 + R20)C \quad (8)$$

Figure 5:
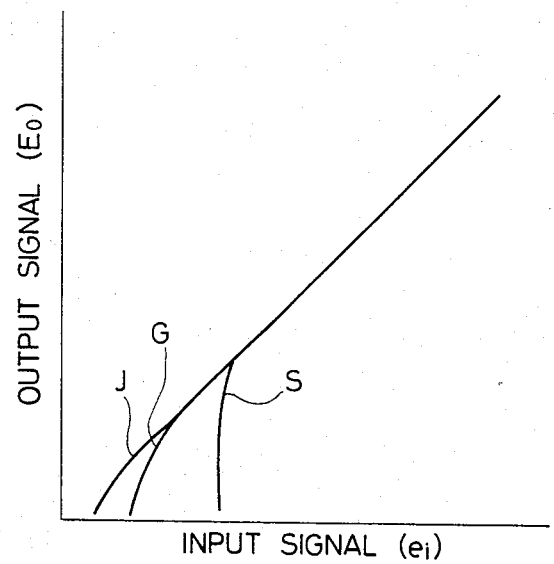
FIG. 5 is a graphic illustration of the input-output characteristics of the prior art and the present invention useful for describing the feature of the present invention.

It is seen from Equation (8) that the recovery time Tr is not dependent on the resistance of silicon diode D13 and it is only necessary to take into account the attack time Ta. This is accomplished by substituting the forward resistance of germanium diodes for Rdf of Equation (5) and choosing the resistance value R18 in relation to R19 so that Rdf' satisfies the attack time Ta in Equation (7) of a given noise reduction system. For example, if R18 is much smaller than R19, the input-vs-output characteristic approaches the curve S and if R18 is much larger than R19 it approaches a curve J as shown in FIG. 5. It is seen therefore that by appropriately choosing R18 in relation to R19 the attack time Ta and other operating parameters of the silicon-constructed circuit of the invention can be approximated to the corresponding operating parameters of the circuit using germanium diodes.

Alternative embodiments of the present invention are illustrated in FIGS. 6 to 16 in which the same reference characters are used to indicate parts corresponding in significance to those in FIG. 1, and each of which embodiments is generally similar to the previous embodiment in that it comprises a linear detector 2, a transfer circuit 3 and an integrator as in the first embodiment, but differs as to details of the detector 2 and transfer circuit 3.

Figure 6:
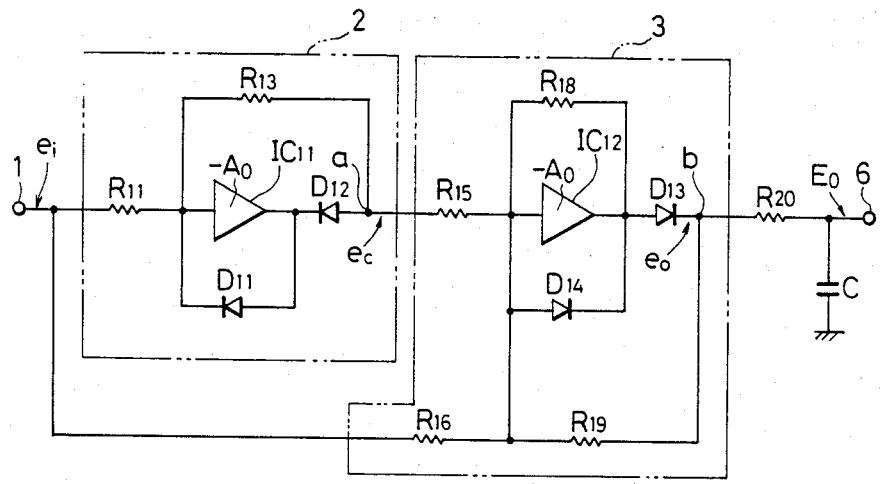
FIG. 6 is a circuit diagram of a second embodiment of the invention.

FIG. 6 is an illustration of a second embodiment of the invention. The linear detector 2 of the second embodiment is of a halfwave linear detector which comprises amplifier IC11 in an inverting amplifier configuration having its output terminal connected through the cathode-to-anode path of silicon diode D12 to pass a negative halfwave to a circuit junction a to generate an output signal $e_c$ thereat. This circuit junction through is coupled a feedback resistor R13 to the input of the amplifier IC11 and further coupled by a resistor R15 to the amplifier IC12 in an inverting amplifier configuration of the transfer circuit 3. The positive halfwave output of amplifier IC11 is applied through negative feedback silicon diode D11 to the input thereof to stabilize the amplifier IC11 when diode D12 is nonconductive.

Figure 8:
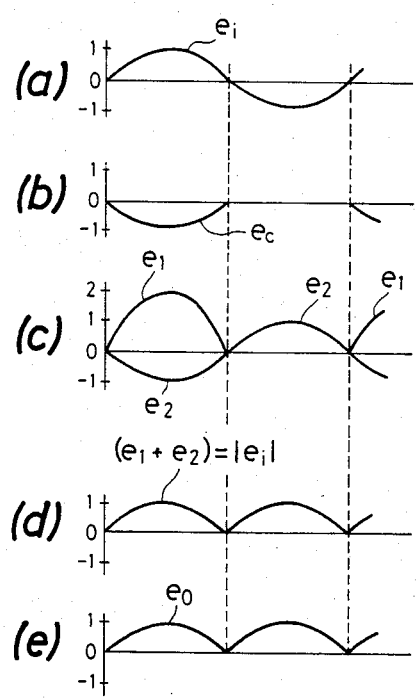
FIG. 8 is a waveform diagram associated with the circuit of FIG. 6.

The inverting amplifier IC12 takes another input signal $e_i$ through resistor R16 from te input terminal 1 to combine it with the negative halfwave output from the detector 2 to generate an output $|e_i|$ which represents to an absolute value of the input signal $e_i$ (shown at d in FIG. 8). This signal is rectified by silicon diode D13 coupled to the output of amplifier IC12 to generate an output $e_o$ (shown at e in FIG. 8) across feedback resistor R19 coupled between a circuit junction b and the input of amplifier IC12. The output of amplifier IC12 is further coupled through the cathode-to-anode path of a silicon diode D14 to the input thereof for application of a negative output of amplifier IC12 to its input to stabilize the amplifier IC12 when diode D13 is nonconductive. The output of amplifier IC12 is further coupled by means of feedback resistor R18 to the input thereof. The circuit junction b is coupled to the time constant circuit formed by resistor R20 and capacitor C and thence to the output terminal 6.

Figure 7A:
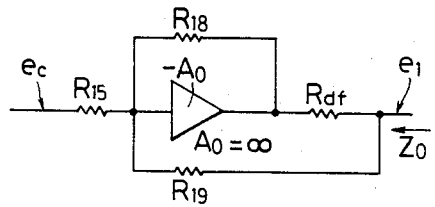
FIGS. 7a and 7b are equivalent circuits of the transfer circuit of FIG. 6.
Figure 7B:
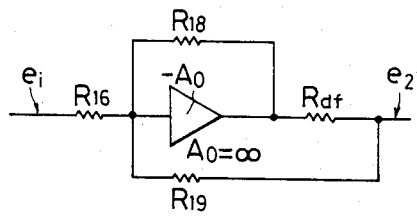

The transfer circuit 3 of the second embodiment can be represented by two equivalent circuits shown in FIGS. 7a and 7b with respect to the input of different polarities. The input-output ratios of these equivalent circuits and the output impedance Zo are given as follows:

$$\frac{e_1}{e_c} = -\frac{R18 \cdot R19}{R15(R18 + Rdf + R19)} \quad (9)$$

$$\frac{e_4}{e_3} = -\frac{R18 \cdot R19}{R16(R18 + Rdf + R19)} \quad (10)$$

$$Zo = \frac{Rdf \cdot R19}{R18 + Rdf + R19} \quad (11)$$

For purposes of illustration, if R15=R16/2, it will be seen from Equations (9) and (10) that the combined outputs $e_1$ and $e_2$ of the equivalent circuits of FIGS. 7a and 7b become equal to $|e_i|$. Similar to the first embodiment, the output impedance Zo of the circuit of FIG. 6 can also be equated to that obtained when the forward resistance Rdf of the silicon diode D13 has changed to Rdf' by the action of a negative feedback operation. Equations (5) and (6) hold when diode D13 is turned on and off respectively, and therefore Equations (7) and (8) are also established in the present embodiment. As described in connection with the previous embodiment, it is seen that by appropriately choosing R18 in relation to R19 desired operating parameters can be obtained which are equal to those of the system using germanium diodes.

Figure 9:
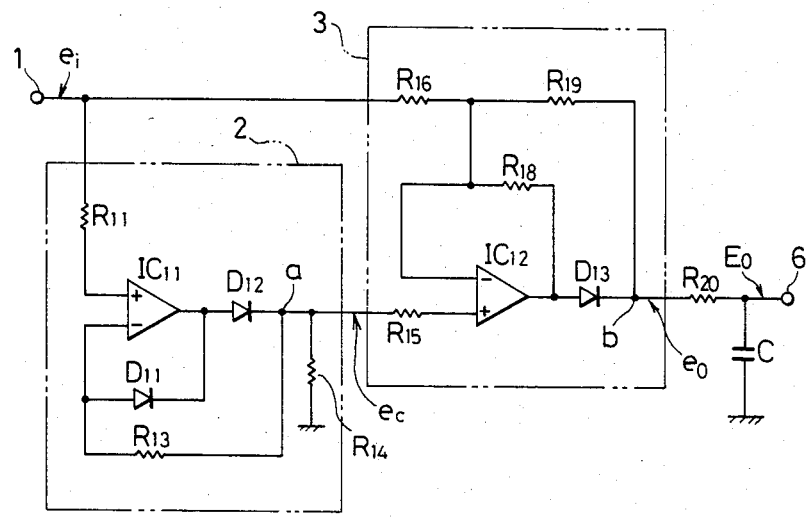
FIG. 9 is a circuit diagram of a third embodiment of the present invention.

A third embodiment of the invention is illustrated in FIG. 9. In the linear detector 2, the an operational amplifier IC11 is in a comparator configuration having the noninverting input coupled by an offset-voltage adjustment resistor R11 to the input terminal 1. The output terminal of comparator IC11 is coupled through the anode-to-cathode path of a silicon diode D11 to a circuit junction a which is coupled to ground by resistor R14 and further coupled through the cathode-to-anode path of silicon diode D11 to the inverting input thereof. The circuit junction a is coupled by feedback resistor R13 to the inverting input of comparator IC11 to generate an output signal $e_c$ at the junction. The signal $e_c$ is applied by a resistor R15 to the noninverting input of the operational amplifier comparator IC12 of the transfer circuit 3. The output of the comparator IC12 is coupled to its inverting input through feedback resistor R18 and through the anode-to-cathode path of silicon diode D13 to a circuit junction b to generate an output signal $e_o$ thereat. The circuit junction b is coupled by feedback resistor R19 to the inverting input of the second comparator IC12 and also to the time constant circuit formed by resistor R20 and capacitor C. The input signal at terminal 1 is also coupled by resistor R16 to the inverting input of second comparator IC12.

Figure 11:
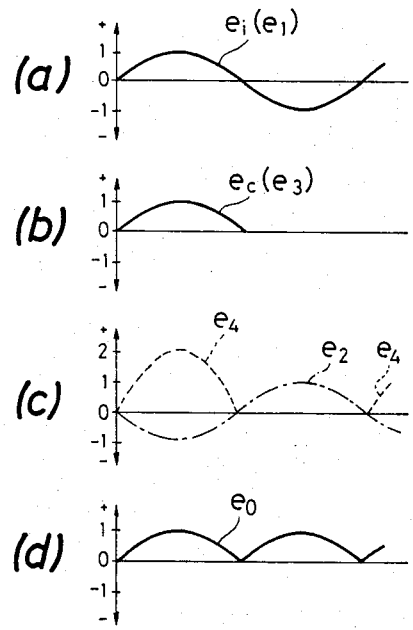
FIG. 11 is a waveform diagram associated with the circuit of FIG. 9.

Upon the application of an input signal $e_i$ ($e_l$) shown at a in FIG. 11 to the input terminal 1, the halfwave linear detector 2 generates a positive halfwave output $e_c$ ($e_3$) shown at b in FIG. 11 which is fed to the noninverting input of a comparator IC12 of a transfer circuit 3.

Figure 10A:
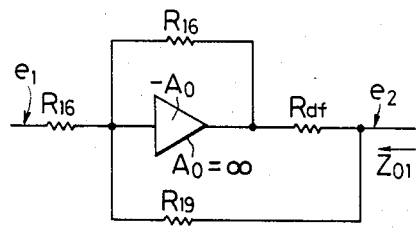
FIGS. 10a and 10b are equivalent circuits of the transfer circuit of FIG. 9.
Figure 10B:
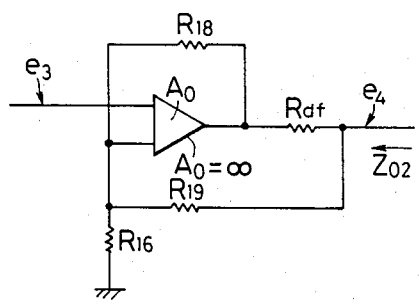

The transfer circuit 3 of FIG. 9 is represented by two equivalent circuits shown in FIGS. 10a and 10b from which the input-to-output ratios $e_2/e_1$, $e_4/e_3$ and the output impedances $Z_{o1}$, $Z_{o2}$ are given as follows:

$$\frac{e_2}{e_1} = -\frac{R18 \cdot R19}{R16(R18 + Rdf + R19)} \quad (12)$$

$$\frac{e_4}{e_3} = 1 + \frac{R18 \cdot R19}{R16(R18 + Rdf + R19)} \quad (13)$$

$$Z_{o1} = Z_{o2} = \frac{Rdf \cdot R19}{R18 + Rdf + R19} \quad (14)$$

By establishing relations R16=R19 and R18=R16×20, for example, the outputs $e_2$ and $e_4$ of the equivalent circuits will become as shown at d in FIG. 11 and as a result an output as shown at d in FIG. 11, will be delivered to the time constant circuit even though Rdf may vary in a range from several tens of ohms to several hundreds ohms. Equations (7) and (8) are also established.

Figure 12:
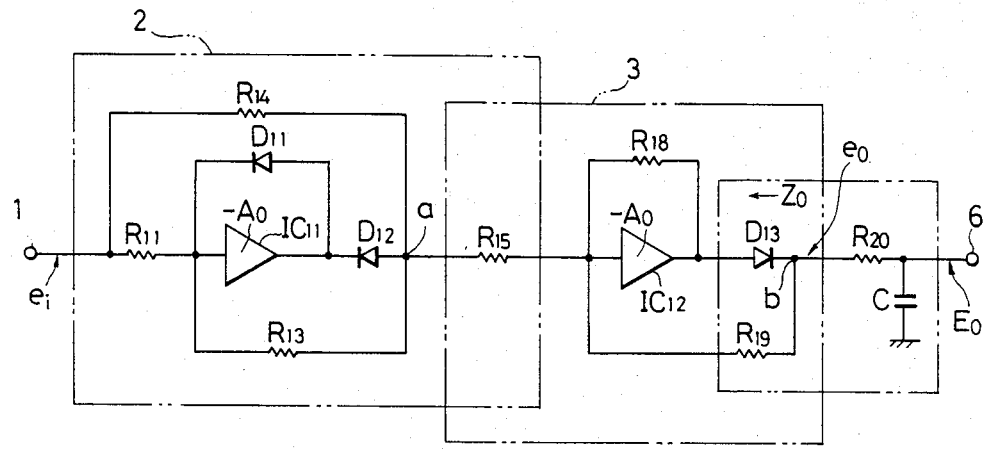
FIG. 12 is a circuit diagram of a fourth embodiment of the present invention.

A fourth embodiment of the invention is shown in FIG. 12. This embodiment differs from the previous embodiments in that it comprises a full-wave linear detector 2 and a transfer circuit 3. The full-wave linear detector 2 generates an absolute value of the input signal and comprises inverting amplifier IC11 having its input coupled by resistor R11 to the input terminal 1 and its output coupled through the cathode-to-anode path of silicon diode D12 to a circuit junction a which is coupled by a feedback resistor R13 to the input of amplifier IC11 and by another feedback resistor R14 to the junction between the input terminal 1 and the resistor R11.

The signal at circuit junction a is coupled by resistor R15 to the input of inverting amplifier IC12 forming part of the transfer circuit 3 which includes silicon diode D13 which couples the positive output of amplifier IC12 to a circuit junction b, the circuit junction b being coupled by feedback resistor R19 to the input of amplifier IC12. The output of amplifier IC12 is further coupled by feedback resistor R18 to the input thereof. The diode D13 and resistor R19 also form part of the time constant circuit 4 with resistor R20 and capacitor C.

Figure 13A:
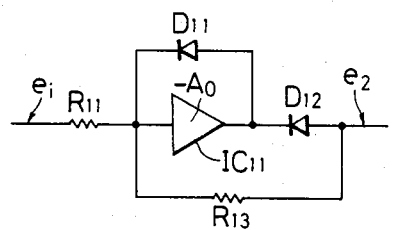
FIGS. 13a and 13b are equivalent circuits of the full-wave linear detector of FIG. 12.
Figure 13B:
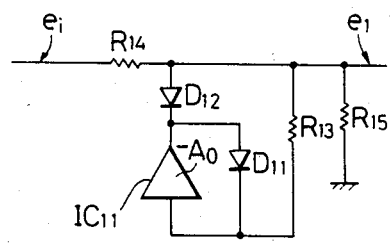

The operation of the full-wave linear detector 2 will be explained by equivalent circuits thereof shown in FIGS. 13a and 13b which are obtained when the input signal at terminal 1 is positive and negative, respectively. In response to a positive halfwave of input signal $e_i$ (shown at a in FIG. 14) diode D12 turns on and diode D11 turns off. The resistor R13 develops a negative halfwave $e_1$ which is derived from FIG. 12a as follows;

$$e_1 = -\frac{R13}{R11} e_i \quad (15)$$

In response to a negative halfwave of input signal $e_i$, diode D12 turns off and diode D11 turns on, causing a negative halfwave $e_2$ to develop across the resistor R13. The negative halfwave $e_2$ is derived from FIG. 13b as follows:

$$e_2 = \frac{R13}{R13 + R14 + \frac{R13 \cdot R14}{R15}} e_i \quad (16)$$

By selecting R13, R14 and R15 so that the following Equation holds, $$k = \frac{R13}{R13 + R14 + \frac{R13 \cdot R14}{R15}} = \frac{R13}{R11} \quad (17)$$

the output signal $e_c$ of the full-wave linear detector is given by $$e_c = k \, |e_i| \quad (18)$$

Figure 14:
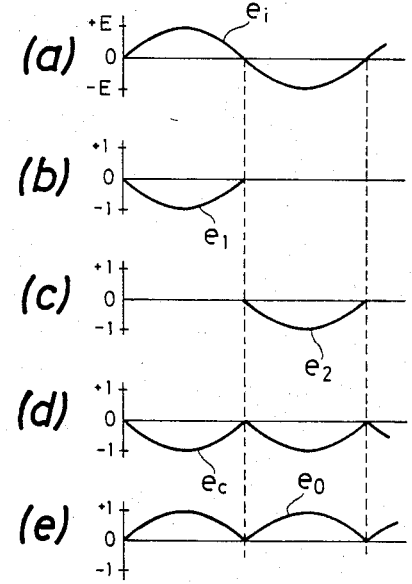
FIG. 14 is a waveform diagram associated with the circuit of FIG. 12.

As shown at d in FIG. 14, the output $e_c$ is applied to the transfer circuit 3 as a linearly detected negative value of the input signal $e_i$ and converted to a positive full-wave $e_o$ shown at e in FIG. 14. The input-to-output characteristic $e_o/e_c$ of the transfer circuit 3 is given by the following Equation, $$\frac{e_o}{e_c} = -\frac{R18 \cdot R19}{R15(R18 + Rdf + R19)} \quad (19)$$

It will be seen that same output impedance and the the attack and recovery times as those of the previous embodiments are obtained in this embodiment.

Figure 15:
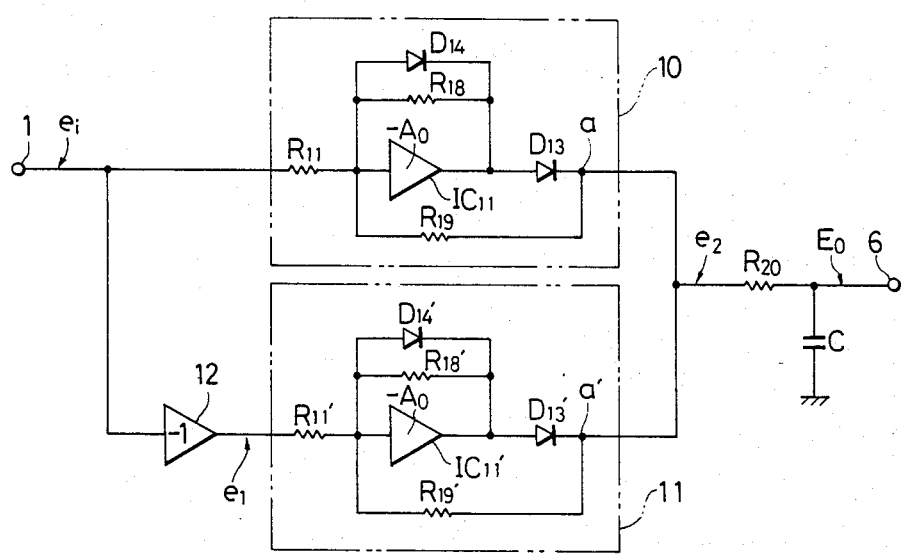
FIG. 15 is a circuit diagram of a fifth embodiment of the present invention.

A fifth alternative embodiment shown in FIG. 15 comprises a pair of nonlinear halfwave rectifier circuits 10 and 11 of identical construction. Each of the nonlinear rectifier circuits provides dual functions of linear detection of a halfwave of the input signal and translation of the input signal to an output signal according to the predetermined transfer function described above. The circuit 10 comprises inverting amplifier IC11 having its input coupled to the input terminal 1 by resistor R11 and its output coupled through the anode-to-cathode path of silicon diode D13 to a circuit junction a. Feedback resistor R19 is coupled from the cathode of diode D13 to the input of amplifier IC11. Feedback resistor R18 is coupled between the output and input of amplifier IC11. Silicon diode D14 is connected in parallel with the resistor R18 to stabilize the gain of amplifier IC11 which would otherwise increase to infinity when diode D13 is turned off. The rectifier circuit 11, similar in construction to circuit 10 with elements being designated by the same but primed numerals, is coupled to the input terminal 1 through a unity gain inverting amplifier 12.

In response to a negative half cycle of the input signal a positive halfwave output is developed in the resistor R19 of the rectifier 10. A positive halfwave output is also developed in the resistor R19' of the rectifier 11 in response to the inverted negative halfwave signal $e_1$ of the positive half cycle of the input signal $e_i$. These positive halfwave outputs are combined into a full-wave positive output $e_2$ at the circuit junction a and fed to the time constant circuit. It is seen that each rectifier circuit provides linear detection and rectification of opposite polarity halfwaves by feedback operation.

Figure 16:
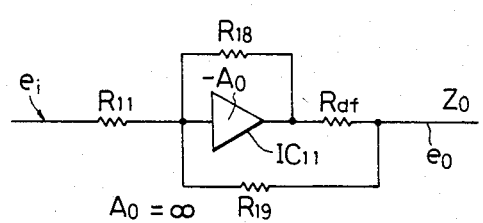
FIG. 16 is an equivalent circuit of each of the half-wave linear detector/rectifiers of FIG. 15.

The input-to-output characteristic $e_o/e_i$ and the output impedance $Zo$ of the fifth embodiment are derived from equivalent circuit shown in FIG. 16 which is similar to those described previously and given as follows.

$$\frac{e_o}{e_i} = -\frac{R18 \cdot R19}{R15(R18 + Rdf + R19)} \frac{R18}{R11} \quad (20)$$

$$Zo = \frac{Rdf - R19}{R18 + Rdf + R19} \quad (21)$$

What is claimed is:

1. A circuit arrangement for deriving a level control signal from an input signal, comprising:

a circuit arrangement input terminal to which said input signal is applied and a circuit arrangement output terminal from which said level control signal is derived;

a linear detector comprising a linear-detector input terminal and a linear-detector output terminal, first amplifier means coupled to said linear-detector input terminal, a first silicon diode coupled to the output of the first amplifier means for passing an output signal therefrom to said linear-detector output terminal, and feedback circuit means for coupling a voltage at said linear-detector output terminal to the input of said first amplifier means;

a transfer circuit having a transfer function describing the relationship between the input-to-output characteristic of a circuit formed by germanium diodes and the input-to-output characteristic of a circuit formed by silicon diodes, the tranfer circuit comprising a transfer-circuit input terminal and a transfer-circuit output terminal, second amplifier means coupled to said transfer-circuit input terminal, a second silicon diode for coupling a voltage at the output of the second amplifier means to said transfer-circuit output terminal, a first feedback resistor for coupling a voltage at said transfer-circuit output terminal to the input of said second amplifier means, and a second feedback resistor for coupling a voltage at the output of said second amplifier means to the input thereof; and a time constant circuit connected to said circuit arrangement output terminal;

said linear-detector input and output terminals and said transfer-circuit input and output terminals being connected in circuit between said circuit arrangement input terminal and said circuit arrangement output terminal.

2. A circuit arrangement for deriving a level control signal from an input signal, comprising:
- a linear detector comprising first amplifier means receptive of said input signal, a first silicon diode coupled to the output of said first amplifier means for passing an output of said first amplifier means to a first circuit junction, and feedback circuit means including at least one resistor for coupling an output signal from said first amplifier means to the input thereof to linearly detect at least one of the opposite polarity halfwaves of said input signal;
- a transfer circuit having a transfer function describing the relationship between the input-to-output characteristic of a circuit formed by germanium diodes and the input-to-output characteristic of a circuit formed by silicon diodes, the transfer circuit including second amplifier means coupled to be responsive to a voltage at said first circuit junction, a second silicon diode coupled to the output of said second amplifier means for passing an output of said second amplifier means to a second circuit junction, a first feedback resistor coupled from said second circuit junction to the input of said second amplifier means, and a second feedback resistor coupled between the output and input of said second amplifier means; and
- a time constant circuit coupled to said second circuit junction to generate said level control signal.

3. A circuit arrangement for deriving a level control signal from an input signal, comprising: an input terminal to which said input signal is applied, an output terminal from which said level control signal is derived, a first comparator having a first input coupled to said input terminal through a resistor and a second input coupled by a resistor to ground, a pair of first and second oppositely poled silicon diodes connected to the output of said first comparator, a first and a second feedback resistor coupled respectively from said first and second diodes to said first input of said first comparator, a second comparator having a first and a second input coupled through respective resistors and through said first and second diodes to the output of said first amplifier, a third silicon diode for coupling an output signal from said second comparator to a circuit junction, a third feedback resistor coupled from said circuit junction to the first input of said second comparator, and a fourth feedback resistor coupled from the output of said second comparator to the first input thereof, and a time constant circuit coupled to said circuit junction for providing an output signal to said output terminal.

4. A circuit arrangement as claimed in claim 3, wherein the second terminal of said second comparator is coupled by a resistor to ground.

5. A circuit arrangement for deriving a level control signal from an input signal, comprising: an input terminal to which said input signal is applied, an output terminal from which said level control signal is derived, a first inverting amplifier coupled by a resistor to said input terminal, a first silicon diode coupled to the output of the first amplifier to pass an output signal therefrom to a first circuit junction, a first feedback resistor for coupling the signal at said first circuit junction to the input of said first amplifier, a second inverting amplifier coupled to said first circuit junction and to said input terminal through respective resistors, a second silicon diode coupled to the output of said second amplifier for passing an output signal therefrom to a second circuit junction, a second feedback resistor for coupling the signal at said second circuit junction to the input of said second amplifier, a third feedback resistor coupled between the output and input of said second amplifier, and a time constant circuit coupled to said second circuit junction for providing an output signal to said output terminal.

6. A circuit arrangement as claimed in claim 5, further comprising a third diode for coupling an output signal of said first amplifier to the input thereof when said first diode is nonconductive, and a fourth diode for coupling an output signal of said second amplifier to the input thereof when said second diode is nonconductive.

7. A circuit arrangement for deriving a level control signal from an input signal, comprising: an input terminal to which said input signal is applied, an output terminal from which said level control signal is derived, a first comparator having a first input coupled to said input terminal through a resistor, a first silicon diode having a first terminal coupled to the output of said first comparator and the other terminal thereof coupled to a first circuit junction, a first feedback resistor for coupling the signal at said first circuit junction to a second input of said first comparator, a second comparator having a first input coupled to said first circuit junction through a resistor, a second silicone diode coupled to the output of said second comparator for passing an output signal therefrom to a second circuit junction, a third feedback resistor for coupling the signal at said second circuit junction to a second input of said second comparator, a third feedback resistor coupled between the output and second input of said second comparator, the second input of said second comparator being coupled through a resistor to said input terminal, and a time constant circuit coupled to said second circuit junction for providing an output signal to said output terminal.

8. A circuit arrangement as claimed in claim 7, wherein said first circuit junction is coupled to ground through a resistor.

9. A circuit arrangement for deriving a level control signal from an input signal, comprising: an input terminal to which said input signal is applied, an output terminal from which said level control signal is derived, a first inverting amplifier coupled to said input terminal through a resistor, a first silicon diode coupled to the output of said first amplifier for passing an output signal therefrom to a first circuit junction, a second silicon diode coupled between the output and input of said first amplifier, a first feedback resistor for coupling the signal at said first circuit junction to the input of said first amplifier, a second feedback resistor for coupling the signal at said first circuit junction to said input terminal, a second inverting amplifier coupled to said first circuit junction through a resistor, a third silicon diode coupled to the output of said second amplifier for passing an output signal therefrom to a second circuit junction, a third feedback resistor for coupling the signal at said second circuit junction to the input of said second amplifier, a fourth feedback resistor coupled between the output and input of said second amplifier, and an integrator coupled to said second circuit junction for providing an output signal to said output terminal.

10. A circuit arrangement for deriving a level control signal from an input signal, comprising: an input terminal to which said input signal is applied, an output terminal from which said level control signal is derived, a first inverting amplifier coupled to said input terminal through a resistor, a first silicon diode coupled to the output signal from said first amplifier for passing a first polarity halfwave of said input signal to a circuit junction, a first feedback resistor for coupling the signal at said circuit junction to the input of said first amplifier, a second feedback resistor coupled between the output and input of said first amplifier, a second inverting amplifier coupled to said input terminal through a resistor, a second silicon diode having a first terminal coupled to the output of said second amplifier and the other terminal thereof coupled to pass thereto a second polarity halfwave of said input signal, a third feedback resistor for coupling the signal at said circuit junction to the input of said second amplifier, a fourth feedback resistor coupled between the output and input of said second amplifier, and a time constant circuit coupled between said circuit junction and said output terminal.

11. A circuit arrangement as claimed in claim 10, further comprising a unity gain inverting amplifier by which one of said first and second amplifiers is coupled to said input terminal.

12. A circuit arrangement as claimed in claim 10 or 11, further comprising a third silicon diode coupled in parallel with said second feedback resistor and a fourth silicon diode coupled in parallel with said fourth feedback resistor.

* * * * *